(12) United States Patent
Yu

(10) Patent No.: US 6,528,851 B1
(45) Date of Patent: Mar. 4, 2003

(54) POST-SILICIDATION IMPLANT FOR INTRODUCING RECOMBINATION CENTER IN BODY OF SOI MOSFET

(75) Inventor: Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/871,191

(22) Filed: May 31, 2001

(51) Int. Cl.⁷ ............................................... H01L 27/01
(52) U.S. Cl. ...................... 257/347; 257/382; 257/611; 257/616; 257/617; 257/754
(58) Field of Search ................. 257/347, 382, 257/611, 616, 617, 754

(56) References Cited

U.S. PATENT DOCUMENTS

| | | | |
|---|---|---|---|
| 5,578,865 A | | 11/1996 | Vu et al. |
| 5,698,869 A | * | 12/1997 | Yoshimi et al. ............. 257/192 |
| 6,023,088 A | * | 2/2000 | Son .............................. 257/347 |
| 6,288,425 B1 | * | 9/2001 | Adan ........................... 257/347 |
| 6,337,500 B1 | * | 1/2002 | Nakaoka et al. ............. 257/347 |
| 6,344,675 B1 | * | 2/2002 | Imai ............................ 257/347 |

* cited by examiner

*Primary Examiner*—Eddie Lee
*Assistant Examiner*—Matthew E. Warren
(74) *Attorney, Agent, or Firm*—Renner, Otto, Boisselle & Sklar, LLP

(57) ABSTRACT

A semiconductor-on-insulator (SOI) transistor is disclosed. The SOI transistor includes a source region, a drain region and a body region disposed therebetween, the body region including a gate disposed thereon, the source and drain regions including respective silicide regions. The body region includes a region of recombination centers formed by atom implantation, wherein atoms forming the region of recombination centers are implanted at an angle from opposite sides of the gate in a direction towards the body region, with the gate and source and drain silicide regions acting as an implant blocking mask, such that the region of recombination centers is disposed between a source/body junction and a drain/body junction. Also disclosed is a method of fabricating the SOI transistor.

8 Claims, 2 Drawing Sheets

POST-SILICIDATION IMPLANT FOR INTRODUCING RECOMBINATION CENTER IN BODY OF SOI MOSFET

TECHNICAL FIELD

The present invention relates generally to semiconductor-on-insulator (SOI) devices and methods of forming the same and, more particularly, to SOI devices and methods for forming which avoid or reduce floating body effects.

BACKGROUND ART

Semiconductor-on-insulator (SOI) materials offer potential advantages over bulk materials for the fabrication of high performance integrated circuits. Dielectric isolation and reduction of parasitic capacitance improve circuit performance, and virtually eliminate latch-up in CMOS circuits. In addition, circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). These floating body effects may result in undesirable performance in SOI devices. It will be appreciated from the foregoing that a need exists for SOI MOSFETs having reduced floating body effects.

SUMMARY OF THE INVENTION

According to one aspect of the invention, the invention is a semiconductor-on-insulator (SOI) transistor. The SOI transistor includes a semiconductor-on-insulator (SOI) transistor, including a source region, a drain region and a body region disposed therebetween, the body region including a gate disposed thereon, the source and drain regions including respective silicide regions; the body region including a region of recombination centers formed by atom implantation, wherein atoms forming the region of recombination centers are implanted at an angle from opposite sides of the gate in a direction towards the body region, with the gate and source and drain silicide regions acting as an implant blocking mask, such that the region of recombination centers is disposed between a source/body junction and a drain/body junction.

According to another aspect of the invention, the invention is a method of fabricating a semiconductor-on-insulator (SOI) transistor. The method includes the steps of providing an active layer disposed on a buried oxide (BOX) layer, the BOX layer being disposed on a substrate, the active layer having an active region defined by isolation regions; forming a transistor in the active region, the transistor having a source region, a drain region and a body region disposed therebetween, the body region including a gate disposed thereon; forming a source silicide region and a drain silicide region in the respective source and drain regions; and implanting the body region with atoms to form a region of recombination centers between a source/body junction and a drain/body junction, wherein the implantation is at an angle from opposite sides of the gate in a direction towards the body region, with the gate and the source and drain silicide regions acting as an implant blocking mask.

BRIEF DESCRIPTION OF DRAWINGS

These and further features of the present invention will be apparent with reference to the following description and drawings, wherein.

DISCLOSURE OF INVENTION

Figure 1:
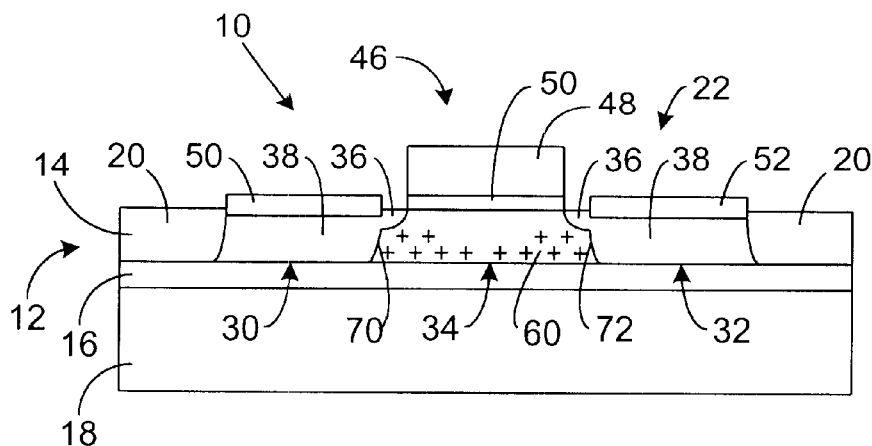
FIG. 1 is a cross-section of a semiconductor-on-insulator (SOI) device according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor-on-insulator device 10 according to the present invention is shown. In the illustrated embodiment, the device 10 is a transistor, more particularly a partially depleted metal oxide semiconductor field effect transistor. The semiconductor device 10 is fabricated in conjunction with a silicon-on-insulator (SOI) wafer 12. The SOI wafer 12 includes an active layer 14 (also referred to as a semiconductor layer 14), a buried insulator layer 16 (also referred to as a buried oxide (BOX) layer 16), and a substrate 18. In one embodiment, the active layer 14 and the substrate 18 are made from silicon, and the BOX layer 16 is made from an oxide, such as silicon oxide or $SiO_2$. The wafer can be formed using techniques such as direct wafer bonding or a separated by implanted oxygen (SIMOX) technique.

Within the active layer 14, isolation regions 20 define the size and placement of an active region 22 in which the SOI device 10 is fabricated. More specifically, within the active region 22 for the SOI device 10, the SOI device 10 includes a source region 30, a drain region 32, and a body region 34 disposed therebetween. As is further described below, the source and drain regions 30 and 32 include shallow extensions 36 and deep doped regions 38.

The source region 30 and the drain region 32 have N+ doping and the body region 34 has P doping, making the SOI device 10 an N-channel device. Alternatively, the source region 30, the drain region 32 and the body region 34 can have any other appropriate doping. For example, the source region 30 and the drain region 32 can have P+ doping and the body region 34 can have N doping (such an SOI device being a P-channel device). Alternatively, the body region 34 can remain undoped.

The SOI device 10 also has a gate 46 disposed on top of the body region 34. The gate 46 includes a gate electrode portion 48, made from a conductive material such as polysilicon. Disposed between the gate electrode portion 48 and the body region 34 is a gate oxide layer, or gate dielectric 50. The gate dielectric 50 can be formed from a material such as silicon dioxide, silicon oxynitride, silicon nitride ($Si_3N_4$), or the like. Alternatively, other gate stack arrangements, as are known in the art, can be used for the gate 46.

The source and drain regions 30 and 32 include respective source and drain silicide regions 50 and 52 on opposite sides of the gate 46. The gate 46 may include a gate silicide region (not shown), if desired. The silicide regions 50 and 52 extend vertically downward from the surface of the silicon layer 14, and may be raised, for example, by epitaxial regrowth of the source and drain regions 30 and 32, or other methods known in the art. In the illustrated embodiment, the source and drain silicide regions 50 and 52 are substantially symmetric about the gate 46, although it will be appreciated that the silicide regions 50 and 52 may be asymmetrical relative to the gate 46. The silicide regions 50 and 52 have respective exposed surfaces (not shown) for external electrical connection.

The body region 34 of the device 10 includes a germanium (Ge) implanted region 60. As is further described below, the germanium is implanted at an angle, using the gate 46 and the silicide regions 50 and 52 as an implant blocking mask (i.e., a self-aligned mask), so as to form recombination centers, represented in the illustrated embodiment by plus signs (+) and indicated generally at reference numeral 60, substantially in the portion of the body region 34 below the channel and between the source and drain regions 30 and 32. The angle of implantation causes a high concentration of germanium to be implanted near a source/body junction 70 and a drain/body junction 72, substantially in the portion of the body region 34 below the shallow extensions 36 of the source and drain regions 30 and 32. The resulting recombination centers 60 remove charges in the body region 34, thereby reducing floating body effects (FBE) in the device 10.

In an alternative embodiment, the implanted germanium 60 can be replaced with implanted xenon (Xe), silicon (Si), krypton (Kr) or argon (Ar). Similar to the germanium, these elements may be used to form recombination centers in the body which act to reduce floating body effects.

Figure 2:
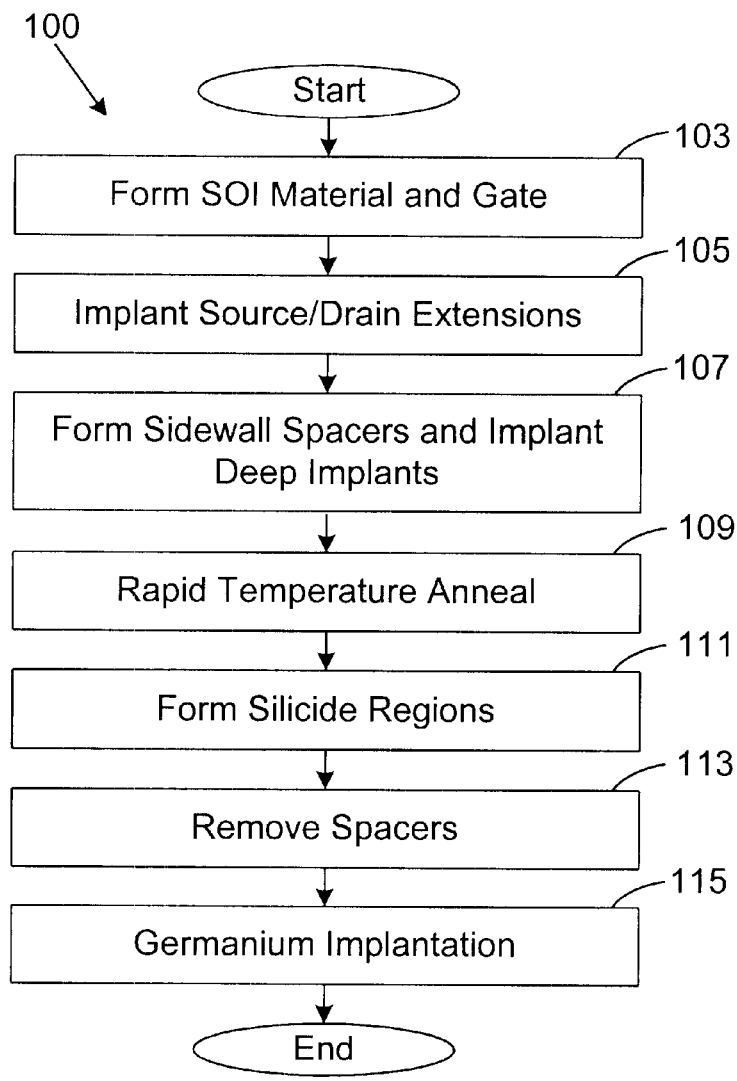
FIG. 2 is a flow chart illustrating a method of fabricating the SOI device of FIG. 1.

Referring now to FIG. 2, a method 100 of fabricating a device 110 in accordance with the present invention is shown in flowchart format. With additional reference to FIG. 3, the method 100 begins in step 103 where a wafer 112 of SOI material and a gate 146 are formed. The wafer 112 has a silicon substrate 118 with a buried oxide (BOX) layer 116 disposed thereon. Disposed on the BOX layer 116 is a silicon active layer 114. The active layer 114 may be initially doped for the fabrication of N-channel or P-channel devices. STI regions 120 are formed and define the size and placement of an active region 122. A gate oxide layer 150 is then formed using conventional techniques. A polysilicon gate portion 148, along with any other desired gate layers to form a gate stack, are formed on the gate oxide 150 using conventional techniques.

Figure 3:
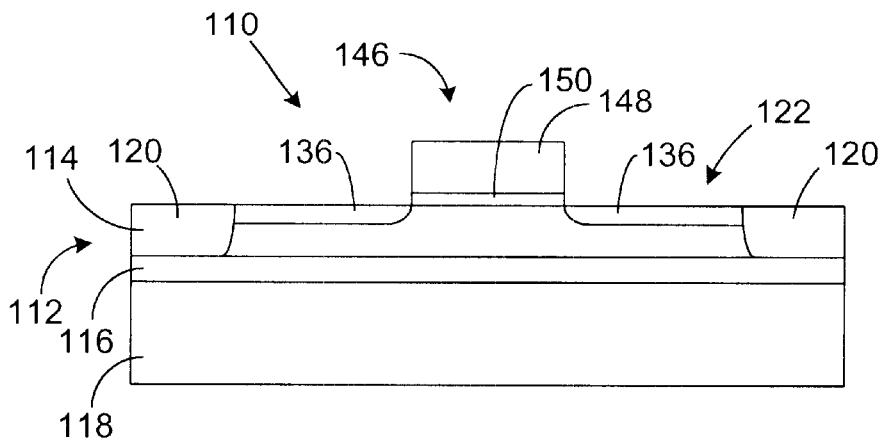
FIGS. 3–5 are cross-sections of the SOI device of FIG. 1 in intermediate stages of fabrication.

Next, in step 105, and still referring to FIG. 3, source and drain extensions 136 are implanted. For an N-channel device, N-type extensions 136 are formed by implanting arsenic (As+) at, for example, an energy of about 1.0 kev to about 3.0 kev. For a P-channel device, P-type extensions 136 are formed by implanting boron (B+) at, for example, an energy of about 0.3 kev to about 1.5 kev. Regardless of the channel type, the implantation dose for the extensions 136 is, for example, about $1\times10^{14}$ atoms/cm$^2$ to about $1\times10^{15}$ atoms/cm$^2$.

Figure 4:
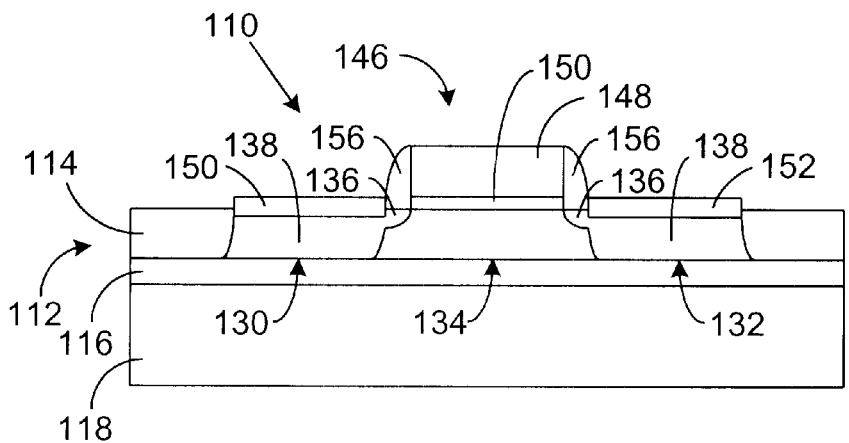

Next, in step 107, and as illustrated in FIG. 4, side wall spacers 156 are formed adjacent the gate 146. The spacers 156 are formed using conventional techniques and are made from a material such as silicon oxide (SiO$_2$) or a nitride (e.g., Si$_3$Na$_4$). The width of the spacers 156 is about 20 to about 100 nanometers, although alternative widths may be suitable for the device being fabricated.

Deep source/drain implants 138 are then implanted. For an N-channel device, N-type deep implantation is made by implanting arsenic at, for example, an energy of about 5 kev to about 30 kev and a dose of about $1\times10^{15}$ atoms/cm$^2$ to about $5\times10^{15}$ atoms/cm$^2$. For a P-channel device, P-type deep implantation is made by implanting boron at, for example, an energy of about 3 kev to about 15 kev and a dose of about $1\times10^{15}$ atoms/cm$^2$ to about $5\times10^{15}$ atoms/cm$^2$.

As one skilled in the art will appreciate, the formation of the source/drain extensions 136 and source/drain deep implants 138 can be carried out using alternative dopants (e.g., phosphorous and/or indium) and/or at other appropriate energy levels and dose levels, as is desirable for the device being fabricated.

Following deep implantation, in step 109 the wafer 112 is subjected to a thermal anneal cycle at about 1,000° C. to about 1,150° C. for a period of about five seconds to about fifteen seconds or, alternatively, a rapid temperature anneal (RTA) cycle for about one second to about 10 seconds.

Next, in step 111, and still referring to FIG. 4, a source silicide region 150 and a drain silicide region 152 are formed on opposite sides of the gate 146. A gate silicide region (not shown) may be formed, if desired, in the gate 146. Silicide formation is initiated by depositing a layer of metal upon the spacers 156, the gate 146 and the exposed portions of the semiconductor layer 114. The metal layer may be formed by sputtering, chemical vapor deposition (CVP), or evaporation. The metal of the metal layer may be a metal such as titanium, cobalt, nickel, or tungsten which is suitable for reacting with the semiconductor material to form silicide.

The silicide regions 150 and 152 have a thickness of about 200 to about 400 Angstroms (Å), with about 30 to about 40 per cent of the silicide regions 150 and 152 extending below the surface of the silicon layer 114. In the illustrated embodiment, the source and drain silicide regions 150 and 152 are substantially symmetric about the gate 146, although it will be appreciated that the silicide regions 150 and 152 may be asymmetrical relative to the gate 146. The silicide regions 150 and 152 have formed thereon exposed surfaces (not shown) for external electrical connection. In step 113, the spacers 156 are removed by wet or dry etching, or other known techniques in the art.

The shallow extensions 136, deep implants 138, and silicide regions 150 and 152 thereby form a source region 130 and a drain region 132, with a body region 134 being disposed between the source and drain regions 130 and 132.

Figure 5:
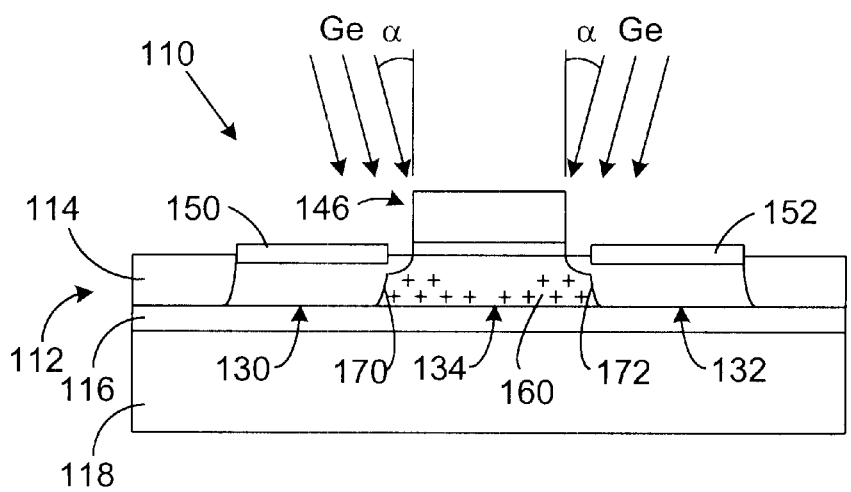

Next, in step 115, and as illustrated in FIG. 5, the device 110 is subjected to germanium (Ge) implantation. The germanium is implanted from opposite sides of the gate 146 in a direction towards the body region 134 at an angle α of about zero (0) degrees to about 15 degrees from vertical, tilted towards the source region 130 on one side of the gate 146 and tilted towards the drain region 132 on an opposite side of the gate 146. The implantation energy range is about 30 keV to about 100 keV, with a dose of about $1\times10^{12}$ atoms/cm$^2$ to about $1\times10^{14}$ atoms/cm$^2$. The implantation forms implant-generated defects, that is, recombination centers, represented in FIG. 5 by plus signs (+).

As will be appreciated, the silicide regions 150 and 152 and the gate 146 act as an implant blocking mask to shield the source and drain regions 130 and 132 and the channel (located below the gate) from the germanium implantation. As a result, the portion of the body region 134 that is implanted with germanium is generally below the channel and between the source and drain regions 130 and 132. Maintaining the angle of implantation less than 15 degrees facilitates achieving a high concentration of germanium implanted near a deep source/body junction 170 and a deep drain/body junction 172, that is, substantially in the portion of the body region 134 below the shallow extensions 136 of the source and drain regions 130 and 132.

It will be appreciated that the profile of the dopant concentration of the implanted germanium, and more particularly the location of the recombination centers (+) resulting therefrom, will be based substantially on the angle a of the implantation and the placement of the silicide regions 150 and 152. In the illustrated embodiment, the dopant concentration is greater near the deep source/body junction 170 and the deep drain/body junction 172 than in the portion of the body region 134 between the deep source/body junction 170 and the deep drain/body junction 172.

It will be appreciated that some germanium may be implanted into the source and drain regions 130 and 132; that is, the germanium implantation may overlap the source/body junction 170 and drain/body junction 172 and extend into the source and drain regions 130 and 132. Also, in the illustrated embodiment, the germanium implantation is substantially symmetric relative to the gate 146. The present invention contemplates implanting germanium only on the source region 130 side of the device 110, or in a manner otherwise asymmetrical relative to the gate. Notwithstanding the aforementioned overlap and asymmetry, the present invention will still operate in its intended manner so long as the germanium is implanted near or in overlapping relation to the source/body junction 170.

The resulting recombination centers 160 formed near or in overlapping relation to the source/body junction 170 and drain/body junction 172 assist in removing charges in the body region 134, thereby reducing floating body effects (FBE) in the device 110. In other words, the source/body junction 170 and/or drain/body junction 172 of the device 110 are leaky junctions which aid in removing accumulated charges from the body.

As indicated above, xenon (Xe) atoms can be used as an alternative to germanium. A suitable energy range for implantation of xenon is about 50 keV to about 150 keV with a dose of about $1\times10^{12}$ atoms/cm$^2$ to about $1\times10^{14}$ atoms/cm$^2$. It will be appreciated that other alternative atoms may be used, such as silicon, krypton or argon.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) transistor, comprising:

a source region, a drain region and a body region disposed therebetween, the body region including a gate disposed thereon, the source and drain regions including respective silicide regions;

the body region including a region of recombination centers formed by atom implantation, such that the region of recombination centers is disposed between a source/body junction and a drain/body junction, the dopant concentration of the region of recombination centers being greater in lateral portions of the body adjacent the source/body junction and the drain/body junction than in the portion therebetween.

2. The SOI transistor according to claim 1, wherein atoms forming the region of recombination centers are implanted at an angle from opposite sides of the gate in a direction towards the body region, and during implantation, the gate, the source silicide region and the drain silicide region act as an implant blocking mask, and wherein the angle is about 0 to about 15 degrees from vertical.

3. The SOI transistor according to claim 1, wherein the atoms are selected from germanium, silicon, argon, krypton and xenon.

4. The SOI transistor according to claim 3, wherein the implantation of germanium atoms or xenon atoms is at a dose of about $1\times10^{12}$ atoms/cm$^2$ to about $1\times10^{14}$ atoms/cm$^2$.

5. The SOI transistor according to claim 3, wherein the implantation of germanium atoms is at an energy range of about 30 keV to about 100 keV.

6. The SOI transistor according to claim 3, wherein the implantation of xenon atoms is at an energy range of about 50 keV to about 150 keV.

7. The SOI transistor according to claim 1, wherein the source region includes a source region extension and source region deep implant, and the drain region includes a drain region extension and a drain region deep implant, and wherein the region of recombination centers is substantially in a portion of the body region below the source and drain region extensions.

8. The SOI transistor according to claim 1, wherein the region of recombination centers is partially disposed in the source and drain regions.

* * * * *